United States Patent
Yamamoto et al.

(10) Patent No.: US 9,355,841 B2
(45) Date of Patent: May 31, 2016

(54) MANUFACTURING METHOD OF HIGH ELECTRON MOBILITY TRANSISTOR

(71) Applicant: Mitsubishi Electric Corporation, Tokyo (JP)

(72) Inventors: Takahiro Yamamoto, Tokyo (JP); Akihito Ohno, Tokyo (JP); Atsushi Era, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/720,177

(22) Filed: May 22, 2015

(65) Prior Publication Data

US 2016/0071727 A1 Mar. 10, 2016

(30) Foreign Application Priority Data

Sep. 9, 2014 (JP) ................. 2014-183510

(51) Int. Cl.
*H01L 21/02* (2006.01)
*H01L 29/66* (2006.01)

(52) U.S. Cl.
CPC ...... *H01L 21/02458* (2013.01); *H01L 21/0254* (2013.01); *H01L 21/02505* (2013.01); *H01L 29/66462* (2013.01)

(58) Field of Classification Search
None
See application file for complete search history.

(56) References Cited

U.S. PATENT DOCUMENTS

2012/0021549 A1   1/2012   Fujikane et al.

FOREIGN PATENT DOCUMENTS

| JP | 2001-44126 A | 2/2001 |
| WO | 2010/113423 A1 | 10/2010 |

OTHER PUBLICATIONS

Derluyn et al., "Improvement of AlGaN/GaN High Electron Mobility Transistor Structures by In Situ deposition of a Si3N4 Layer," J. Appl. Phys, 98, 054501 (2005).*
Cheng et al.; "AlGaN/GaN High Electron Mobility Transistors Grown on 150mm Si(111) Substrates with High Uniformity"; Japanese Journal of Applied Physics; vol. 47, No. 3; pp. 1553-1555.

* cited by examiner

*Primary Examiner* — Asok K Sarkar
(74) *Attorney, Agent, or Firm* — Studebaker & Brackett PC

(57) ABSTRACT

A manufacturing method of a high electron mobility transistor includes: forming a GaN channel layer on a semi-insulating substrate in a first growth condition; forming a transition layer on the GaN channel layer while the first growth condition is changed to a second growth condition; and forming an AlGaN electron supply layer on the transition layer in the second growth condition, wherein the GaN channel layer, the transition layer, and the AlGaN electron supply layer are continuously formed without interrupting growth.

6 Claims, 3 Drawing Sheets

MANUFACTURING METHOD OF HIGH ELECTRON MOBILITY TRANSISTOR

BACKGROUND OF THE INVENTION

1. Field of the Invention

The present invention relates to a manufacturing method of a high electron mobility transistor (HEMT) having an AlGaN/GaN hetero structure.

2. Background Art

GaN has a wider bandgap than prior-art Si and GaAs and its breakdown field is higher by one digit. Therefore, GaN HEMT is difficult to be broken even under a high electric field and is suitable for a high-voltage operation. Moreover, GaN has a larger saturated electron speed in a high electric field region than prior-art semiconductor materials. This is advantageous for a high-speed operation of a device, and the effect is particularly marked in a high-frequency device with a short channel in which a high electric field is applied to the vicinity of a gate electrode. For manufacture of this GaN HEMT, a metal organic chemical vapor deposition (MOCVD) method is used in many cases.

A sapphire substrate has been widely used for epitaxial growth of GaN by the MOCVD method, but since its lattice matching performance with GaN is low and thermal expansion coefficient is different, GaN crystallinity could not be improved in the past. After that, a technology of a low-temperature buffer layer has been established, and GaN crystallinity after growth is improved, and a device fabrication technology mainly for blue and white LED applications has achieved a rapid progress. However, since further improvement of crystallinity such as lower dislocation and the like is difficult and low heat conduction of the sapphire itself results in insufficient heat radiation when being integrated into a device and lowered device performance, and there is a persistent demand for alternative substrate materials. SiC with high lattice matching performance and stability at a high temperature is one of candidates, but it has a problem that its high cost makes an increase of a diameter difficult in addition to a problem of a quality of the crystal itself such as a micro pipe despite the recent improvement.

On the other hand, a Si substrate is capable of realizing a sufficiently larger diameter and lower dislocation and is stably available at a low cost. However, in a state in which a GaN layer is accumulated on a low-temperature AlN buffer layer and then, it is returned to a room temperature, in a case of a sapphire substrate, a compression stress acts on the GaN layer and a crack is hardly generated, while in a case of the Si substrate, differences in the lattice matching performance and heat expansion coefficient, a tensile stress results in a crack to be generated easily. In addition, there have been many problems such as melt-back etching related to a reaction between Ga (or GaN) and Si and the like, but technological development such as a multi-layer film buffer layer has progressed recently and has achieved a sufficiently practical level.

In the GaN HEMT, on a substrate of sapphire, SiC or Si, an undoped GaN layer and an undoped AlGaN layer are sequentially formed through a buffer layer for relaxing lattice mismatch. In the vicinity of an interface between the GaN layer and the AlGaN layer, a piezo effect caused by distortion of the AlGaN layer and high-concentration two-dimensional electron gas is induced by spontaneous polarization, whereby a channel portion of the GaN HEMT is generated (see Japanese Patent Laid-Open No. 2001-44126, for example).

SUMMARY OF THE INVENTION

In an epitaxial growth of the GaN HEMT, since optimal conditions (temperature, pressure, gas flowrate and the like) when the GaN layer and the AlGaN layer grow are different, growth is interrupted on its interface. Thus, damage, trap or the like are formed on the surface of the GaN layer, which results in a problem that device characteristics deteriorate.

The present invention was made in order to solve the above-described problem and has an object to obtain a manufacturing method of a high electron mobility transistor which can suppress damage, trap or the like on the surface of the GaN channel layer and can improve device characteristics.

According to the present invention, a manufacturing method of a high electron mobility transistor includes: forming a GaN channel layer on a semi-insulating substrate in a first growth condition; forming a transition layer on the GaN channel layer while the first growth condition is changed to a second growth condition; and forming an AlGaN electron supply layer on the transition layer in the second growth condition, wherein the GaN channel layer, the transition layer, and the AlGaN electron supply layer are continuously formed without interrupting growth.

In the present invention, the transition layer is formed while the growth condition of the GaN channel layer is changed to the growth condition of the AlGaN electron supply layer between the formation of the GaN channel layer and the formation of the AlGaN electron supply layer. As a result, since each of the epitaxial layers can be continuously formed without growth interruption, damage, trap or the like on the surface of the GaN channel layer are suppressed, and the device characteristics can be improved.

Other and further objects, features and advantages of the invention will appear more fully from the following description.

DETAILED DESCRIPTION OF THE PREFERRED EMBODIMENTS

A manufacturing method of a high electron mobility transistor according to the embodiments of the present invention will be described with reference to the drawings. The same components will be denoted by the same symbols, and the repeated description thereof may be omitted.

Embodiment 1

Figure 1:
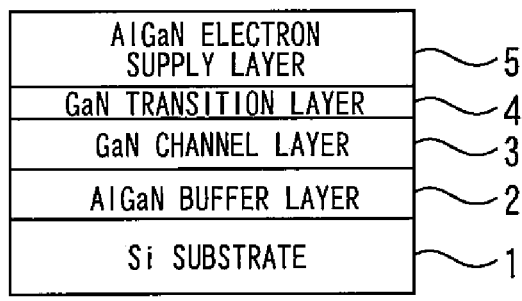
FIG. 1 is a sectional view illustrating the high electron mobility transistor according to the embodiment 1 of the present invention.
Figure 2:
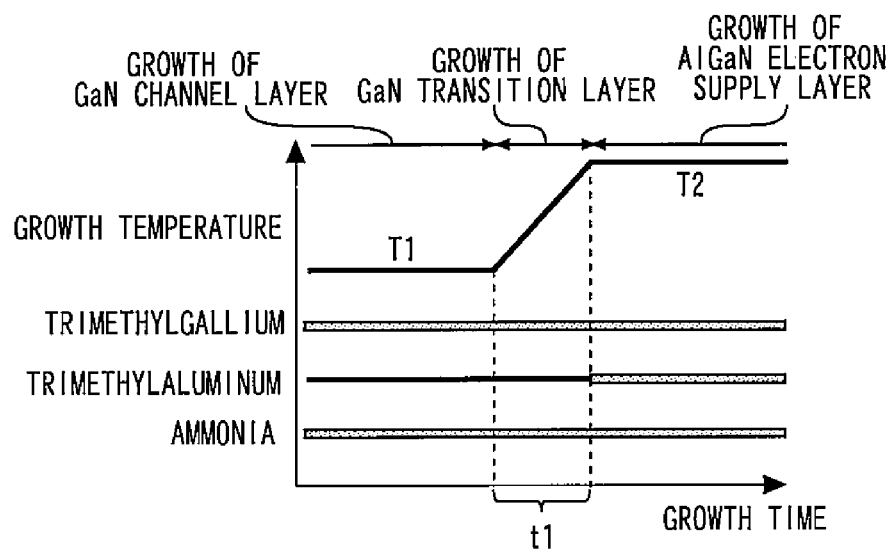
FIG. 2 is a view illustrating a growth sequence of the high electron mobility transistor according to the embodiment 1 of the present invention.

A manufacturing method of a high electron mobility transistor according to an embodiment 1 of the present invention will be described by referring to the attached drawings. FIG. 1 is a sectional view illustrating the high electron mobility transistor according to the embodiment 1 of the present invention. FIG. 2 is a view illustrating a growth sequence of the high electron mobility transistor according to the embodiment 1 of the present invention.

An $Al_xGa_yN$ (x+y=1) as an epitaxial layer is formed by the MOCVD method on a Si substrate 1 which is a semi-insulating substrate. In this case, the Si substrate 1 placed on a susceptor heated by a heating device to a predetermined temperature is held in a reactor. Into this reactor, trimethylaluminum, trimethylgallium or a mixed gas of 2 types or more of these organic metal gases and ammonia which is a nitrogen material are introduced from a gas introduction portion together with a carrier gas such as hydrogen and nitrogen. By means of a reaction between these organic metals and ammonia, the $Al_xGa_yN$ layer is accumulated on the Si substrate 1.

Specifically, the AlGaN buffer layer 2 with a layer thickness of 1.5 μm is formed on the Si substrate 1. Subsequently, an undoped GaN channel layer 3 with a layer thickness of 1.0 μm is formed on the AlGaN buffer layer 2 in a first growth condition. The first growth condition has a first growth temperature T1, pressure, gas flowrate and the like.

Subsequently, a GaN transition layer 4 is formed on the GaN channel layer 3 while the first growth condition is changed to a second growth condition. The second growth condition has a second growth temperature T2 higher than the first growth temperature T1, pressure, gas flowrate and the like. Therefore, the GaN transition layer 4 is formed while the first growth temperature T1 is raised to the second growth temperature T2.

On the GaN transition layer 4, an undoped AlGaN electron supply layer 5 with a layer thickness of 25 nm is formed in the second growth condition. The AlGaN electron supply layer 5 is an $Al_{0.2}Ga_{0.8}N$ layer, for example. After that, an electrode and a wire are formed and a backside grinding is performed. Lastly, dicing, die-bonding, wire-bonding, and packaging are performed so as to complete a high electron mobility transistor.

Here, the GaN channel layer 3, the GaN transition layer 4, and the AlGaN electron supply layer 5 are continuously formed without interrupting the growth. Specifically, after the GaN channel layer 3 is formed while trimethylgallium which is a material of Ga is supplied, the GaN transition layer 4 is formed without stopping supply of trimethylgallium while the growth condition such as the temperature, pressure, gas flowrate and the like is changed to the growth condition of the AlGaN electron supply layer 5. After the transition is finished, supply of trimethylaluminum which is a material of Al is started, and the AlGaN electron supply layer 5 is formed. A supply amount of trimethylaluminum is adjusted as appropriate so that a desired Al composition (here, x=0.2) can be obtained in the AlGaN electron supply layer 5. Here, ammonia which is a nitrogen material and the carrier gas such as hydrogen and nitrogen are supplied at all times during the growth.

Figure 3:
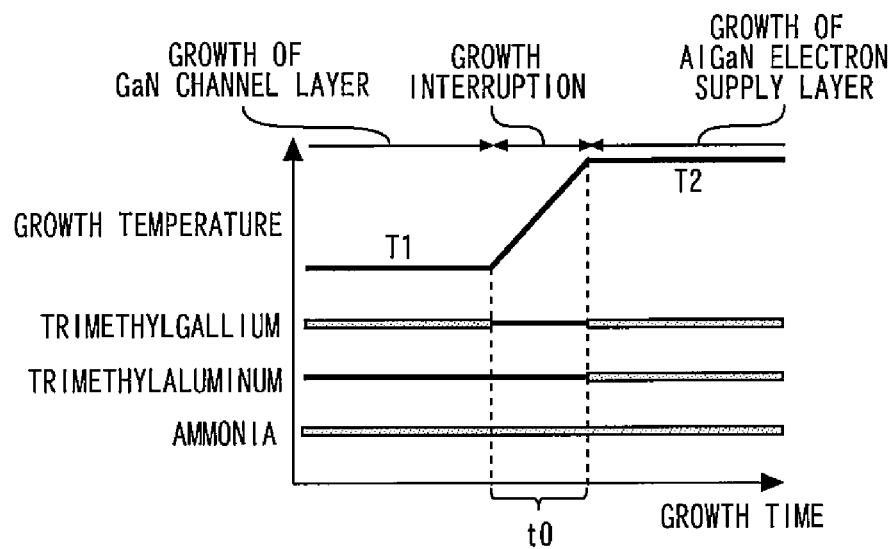
FIG. 3 is a view illustrating a growth sequence of the high electron mobility transistor according to the comparative example.

Subsequently, an effect of this embodiment will be described in comparison with a comparative example. FIG. 3 is a view illustrating a growth sequence of the high electron mobility transistor according to the comparative example. In the comparative example, growth interruption is performed between formation of the GaN channel layer 3 and formation of the AlGaN electron supply layer 5. Thus, damage, trap or the like are formed on the surface of the GaN channel layer 3, and device characteristics deteriorate.

On the other hand, in this embodiment, the GaN transition layer 4 is formed while the growth condition of the GaN channel layer 3 is changed to the growth condition of the AlGaN electron supply layer 5 between the formation of the GaN channel layer 3 and the formation of the AlGaN electron supply layer 5. As a result, since each of the epitaxial layers can be continuously formed without growth interruption, damage, trap or the like on the surface of the GaN channel layer are suppressed, and the device characteristics such as a maximum current, output, efficiency and the like can be improved. Moreover, by setting a growth time T1 of the GaN transition layer 4 to 60 sec or less, a crystal quality of the GaN channel layer 3 in the vicinity of an interface is improved, and the device characteristics can be further improved.

Embodiment 2

Figure 4:
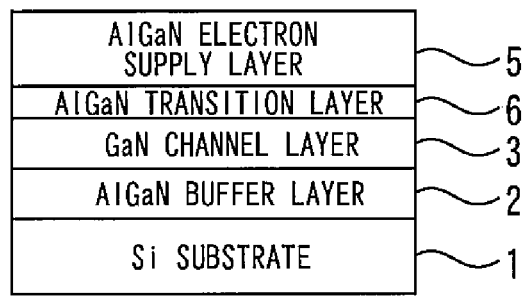
FIG. 4 is a sectional view illustrating the high electron mobility transistor according to the embodiment 2 of the present invention.
Figure 5:
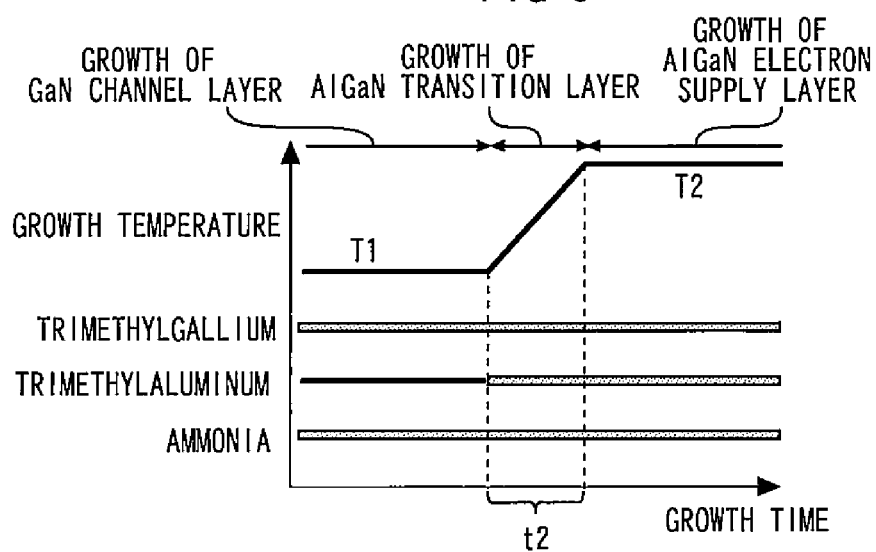
FIG. 5 is a view illustrating a growth sequence of the high electron mobility transistor according to the embodiment 2 of the present invention.

A manufacturing method of a high electron mobility transistor according to an embodiment 2 of the present invention will be described by referring to the attached drawings. FIG. 4 is a sectional view illustrating the high electron mobility transistor according to the embodiment 2 of the present invention. FIG. 5 is a view illustrating a growth sequence of the high electron mobility transistor according to the embodiment 2 of the present invention.

In this embodiment, instead of the GaN transition layer 4 in the embodiment 1, an AlGaN transition layer 6 is formed. Specifically, after the GaN channel layer 3 is formed while trimethylgallium which is a material of Ga is supplied, supply of trimethylaluminum which is a material of Al is started without stopping the supply of trimethylgallium, and the AlGaN transition layer 6 is formed while the growth condition such as temperature, pressure, gas flowrate and the like is changed to the growth condition of the AlGaN electron supply layer 5. Even after the transition of the growth condition is finished, the growth of the AlGaN electron supply layer 5 is continued until a desired film thickness (here, 25 nm) is obtained. Here, a supply amount of trimethylaluminum is adjusted as appropriate so that a desired Al composition (here, x=0.2) can be obtained in the AlGaN electron supply layer 5. Here, ammonia which is a nitrogen material and the carrier gas such as hydrogen and nitrogen are supplied at all times during the growth. The other processes are similar to those in the embodiment 1.

As described above, in this embodiment, the AlGaN transition layer 6 is formed while the growth condition of the GaN channel layer 3 is changed to the growth condition of the AlGaN transition layer 6 between the formation of the GaN channel layer 3 and the formation of the AlGaN transition layer 6. As a result, since each of the epitaxial layers can be continuously formed without growth interruption, damage, trap or the like on the surface of the GaN channel layer are suppressed, and the device characteristics such as a maximum current, output, efficiency and the like can be improved. Moreover, since deterioration of the crystal quality of the GaN channel layer 3 can be suppressed more than the embodiment 1, the device characteristics can be further improved as compared with the embodiment 1. Moreover, by setting a growth time T2 of the AlGaN transition layer 6 to 60 sec or less, a crystal quality of the AlGaN electron supply layer 5 in the vicinity of an interface is improved, and the device characteristics can be further improved.

Embodiment 3

Figure 6:
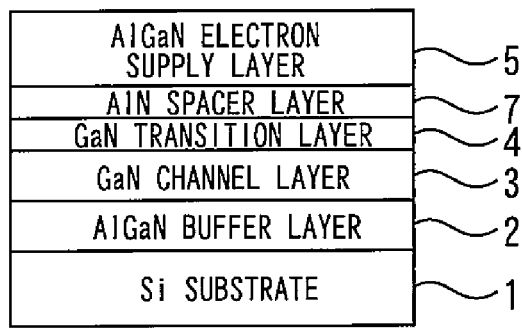
FIG. 6 is a sectional view illustrating the high electron mobility transistor according to the embodiment 3 of the present invention.
Figure 7:
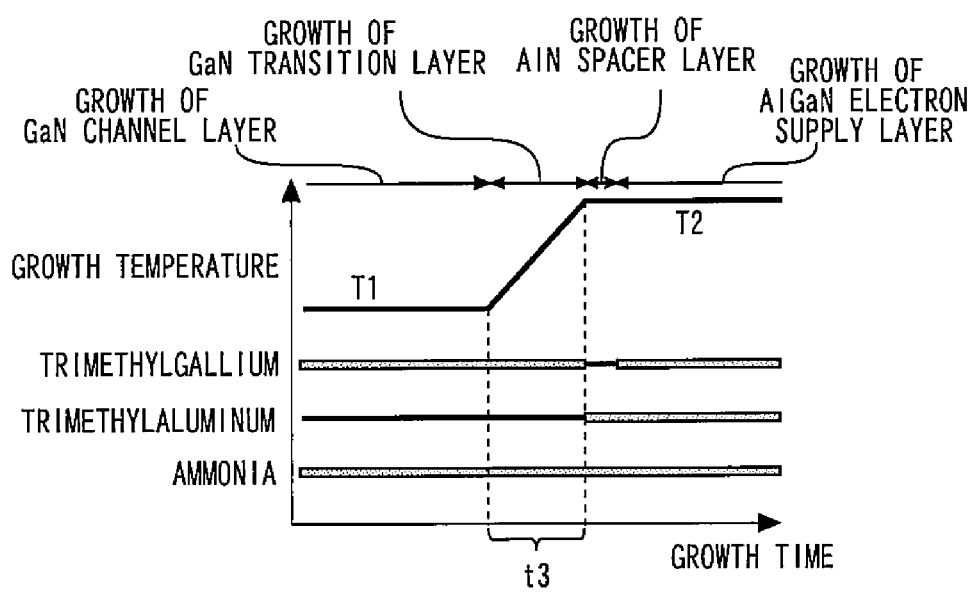
FIG. 7 is a view illustrating a growth sequence of the high electron mobility transistor according to the embodiment 3 of the present invention.

A manufacturing method of a high electron mobility transistor according to an embodiment 3 of the present invention will be described by referring to the attached drawings. FIG. 6 is a sectional view illustrating the high electron mobility transistor according to the embodiment 3 of the present invention. FIG. 7 is a view illustrating a growth sequence of the high electron mobility transistor according to the embodiment 3 of the present invention.

In this embodiment, an AlN spacer layer 7 with a layer thickness of 1 nm is formed in the second growth condition between the GaN transition layer 4 and the AlGaN electron supply layer 5. Specifically, after the GaN channel layer 3 is formed while trimethylgallium which is a material of Ga is supplied, the GaN transition layer 4 is formed while the growth condition such as temperature, pressure, gas flowrate and the like is changed to a growth condition of the AlN spacer layer 7 without stopping supply of trimethylgallium. After the growth of the GaN transition layer 4 is finished, the supply of trimethylgallium is stopped, supply of trimethylaluminum which is a material of Al is started, and the AlN spacer layer 7 is formed. Here, ammonia which is a nitrogen material and the carrier gas such as hydrogen and nitrogen are supplied at all times during the growth. The other processes are similar to those in the embodiment 1.

As described above, in this embodiment, the GaN transition layer 4 is formed while the growth condition of the GaN channel layer 3 is changed to the growth condition of the AlN spacer layer 7 between the formation of the GaN channel layer 3 and the formation of the AlN spacer layer 7. As a result, since each of the epitaxial layers can be continuously formed without growth interruption, damage, trap or the like on the surface of the GaN channel layer are suppressed, and the device characteristics such as a maximum current, output, efficiency and the like can be improved. Moreover, by setting a growth time T3 of the GaN transition layer 4 to 60 sec or less, a crystal quality of the GaN channel layer 3 in the vicinity of an interface is improved, and the device characteristics can be further improved.

In the embodiments 1 to 3, the MOCVD method is used for formation of a III-V group nitride semiconductor film, but this is not limiting, and a hydride vapor phase epitaxy (HVPE) method, a molecular beam epitaxy (MBE) method or the like may be used. Moreover, the Si substrate 1 is used as a semi-insulating substrate, but a sapphire substrate or a SiC substrate and the like may be used.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-183510, filed on Sep. 9, 2014 including specification, claims, drawings and summary, on which the Convention priority of the present application is based, is incorporated herein by reference in its entirety.

What is claimed is:

1. A manufacturing method of a high electron mobility transistor comprising:
    forming a GaN channel layer on a semi-insulating substrate in a first growth condition;
    forming a transition layer on the GaN channel layer while the first growth condition is changed to a second growth condition; and
    forming an AlGaN electron supply layer on the transition layer in the second growth condition, wherein
    the GaN channel layer, the transition layer, and the AlGaN electron supply layer are continuously formed without interrupting growth,
    the first growth condition has a first growth temperature,
    the second growth condition has a second growth temperature higher than the first growth temperature, and
    the transition layer is formed while the first growth temperature is raised to the second growth temperature.

2. The manufacturing method of the high electron mobility transistor of claim 1, wherein after the GaN channel layer is formed while trimethylgallium is supplied, the transition layer is formed without stopping supply of the trimethylgallium.

3. The manufacturing method of the high electron mobility transistor of claim 1, wherein the transition layer is AlGaN.

4. The manufacturing method of the high electron mobility transistor of claim 1, wherein a growth time of the transition layer is 60 sec or less.

5. A manufacturing method of a high electron mobility transistor comprising:
    forming a GaN channel layer on a semi-insulating substrate in a first growth condition;
    forming a transition layer on the GaN channel layer while the first growth condition is changed to a second growth condition; and
    forming an AlGaN electron supply layer on the transition layer in the second growth condition, wherein
    the GaN channel layer, the transition layer, and the AlGaN electron supply layer are continuously formed without interrupting growth, and
    the transition layer is GaN.

6. The manufacturing method of the high electron mobility transistor of claim 5, further comprising forming an AlN spacer layer in the second growth condition between the transition layer and the AlGaN electron supply layer.

* * * * *